(12) United States Patent
Shen et al.

(10) Patent No.: US 10,965,253 B2
(45) Date of Patent: Mar. 30, 2021

(54) MUTE MECHANISM WITH REDUCED POP NOISE IN AUDIO AMPLIFIER SYSTEMS AND METHODS

(71) Applicant: SYNAPTICS INCORPORATED, San Jose, CA (US)

(72) Inventors: Dan Shen, Irvine, CA (US);
Balakishan Challa, Irvine, CA (US);
Lorenzo Crespi, Costa Mesa, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 16/357,244

(22) Filed: Mar. 18, 2019

(65) Prior Publication Data

US 2020/0220502 A1 Jul. 9, 2020

Related U.S. Application Data

(60) Provisional application No. 62/789,461, filed on Jan. 7, 2019.

(51) Int. Cl.
*H03F 3/72* (2006.01)
*H03F 1/26* (2006.01)
(Continued)

(52) U.S. Cl.
CPC ............... *H03F 1/26* (2013.01); *H03F 3/185* (2013.01); *H03F 3/45* (2013.01)

(58) Field of Classification Search
CPC ..................................... H03F 3/45; H03F 3/72
(Continued)

(56) References Cited

U.S. PATENT DOCUMENTS 6,445,247 B1 * 9/2002 Walker .................. H03F 1/0222
330/10
2005/0270093 A1 12/2005 Kurokawa
(Continued)

FOREIGN PATENT DOCUMENTS

KR 10-2008-0034255 4/2008
WO WO 03/075456 9/2003

OTHER PUBLICATIONS

Written Opinion and International Search Report for International App. No. PCT/US2020/012427, 13 pages.

*Primary Examiner* — Steven J Mottola
(74) *Attorney, Agent, or Firm* — Haynes and Boone, LLP

(57) ABSTRACT

Systems and methods are provided for improved noise performance of audio amplifiers. In one example, a system includes a multistage amplifier comprising at least a first stage amplifier and a second stage amplifier. The system further includes a plurality of switches disposed within the multistage amplifier to configure the multistage amplifier. The system further includes a control signal configured to control the multistage amplifier to a normal amplification mode or a mute state, wherein the multistage amplifier is adapted to amplify an input signal in the normal amplification mode, the multistage amplifier is adapted to output a zero signal in the mute state, and internal amplification stages of the multistage amplifier are disabled in the mute state, and output stages of each of the at least first stage amplifier and the second stage amplifier are electrically shorted and/or shorted to a fixed bias voltage in the mute state.

20 Claims, 5 Drawing Sheets

(51) Int. Cl.
*H03F 3/45* (2006.01)
*H03F 3/185* (2006.01)

(58) Field of Classification Search
USPC .......................................... 330/51; 381/94.5
See application file for complete search history.

(56) References Cited

U.S. PATENT DOCUMENTS

| | | |
|---|---|---|
| 2009/0208032 A1 | 8/2009 | Wu |
| 2011/0116653 A1* | 5/2011 | Schuurmans ........... H03F 3/187 |
| | | 381/94.5 |
| 2015/0071464 A1 | 3/2015 | Du et al. |

* cited by examiner

MUTE MECHANISM WITH REDUCED POP NOISE IN AUDIO AMPLIFIER SYSTEMS AND METHODS

CROSS-REFERENCE TO RELATED APPLICATIONS

The present application claims priority to and the benefit of U.S. Provisional Patent Application No. 62/789,461, filed Jan. 7, 2019, and entitled "MUTE MECHANISM WITH REDUCED POP NOISE IN AUDIO AMPLIFIER SYSTEMS AND METHODS", which is hereby incorporated by reference.

TECHNICAL FIELD

The present disclosure, in accordance with one or more examples, relates generally to processing analog signals and, more particularly for example, to improving noise performance within high performance audio amplifiers.

BACKGROUND

Many modern devices such as laptop computers, computer tablets, MP3 players, and smart phones provide high fidelity audio signals for internal or external speaker connectivity. Such systems may generate audio content digitally, convert the digital signal to an analog signal, amplify the analog signal, and deliver an amplified analog current signal to an audio transducer. In some high-fidelity systems, a multistage audio amplifier includes noise muting circuits to reduce unwanted noise when the audio signal is of a low level. To prevent unwanted noise, conventional noise muting circuits may short an output of a multistage audio amplifier. Unfortunately, conventional noise muting circuits may not adjust a bias of internal amplifier stages. When the noise muting is released, internal nodes of the internal amplifier stages are not at a correct voltage for signal amplification and may cause voltage glitches on an increasing input signal and the amplifier output may produce "pop noise". Additionally, conventional noise muting circuits may short a resistive amplifier feedback to reduce signal noise. However, the multistage amplifier still produces circuit noise resulting in unwanted noise on an audio output signal if only the resistive feedback is shorted. Thus, a user may be subject to a less enjoyable listening experience using a headphone device, for example. In view of the foregoing, there remains a need in the art for improved low signal level noise reduction that provides for improved audio amplifier performance.

SUMMARY

The present disclosure provides systems and methods that address a need in the art for improved noise reduction within amplifiers used in modern devices, such as modern devices that incorporate speaker connectivity.

In various examples, a system includes a multistage amplifier comprising at least a first stage amplifier and a second stage amplifier, a plurality of switches disposed within the multistage amplifier to configure the multistage amplifier, and a control signal configured to control the multistage amplifier to a normal amplification mode or a mute state, wherein the multistage amplifier is adapted to amplify an input signal in the normal amplification mode, wherein the multistage amplifier is adapted to output a zero signal in the mute state, and wherein internal amplification stages of the multistage amplifier are disabled in the mute state, and output stages of each of the at least first stage amplifier and the second stage amplifier are electrically shorted and/or shorted to a fixed bias voltage in the mute state.

In various examples, a system includes a multistage amplifier comprising a plurality of amplifier stages, a plurality of switches disposed within the multistage amplifier and coupled to an output of each of the plurality of amplifier stages, an envelope detection circuit adapted to sense a voltage at an output port of the multistage amplifier and control the plurality of switches to electrically connect the output of each of the plurality of amplifier stages to a DC voltage signal that is substantially equal to a quiescent operating voltage of each of the plurality of amplifier stages in response to the sensed voltage.

In various examples, a method includes furnishing a multistage amplifier comprising a plurality of amplifier stages, disposing a plurality of switches within the multistage amplifier and coupled to an output of each of the plurality of amplifier stages, sensing a voltage, by an envelope detection circuit, at an output port of the multistage amplifier, and controlling, by the envelope detection circuit, the plurality of switches to electrically connect the output of each of the plurality of amplifier stages to a DC voltage signal that is substantially equal to a quiescent operating voltage of each of the plurality of amplifier stages in response to the sensed voltage.

The scope of the present disclosure is defined by the claims, which are incorporated into this section by reference. A more complete understanding of the present disclosure will be afforded to those skilled in the art, as well as a realization of additional advantages thereof, by a consideration of the following detailed description of one or more examples. Reference will be made to the appended sheets of drawings that will first be described briefly.

BRIEF DESCRIPTION OF THE DRAWINGS

Aspects of the disclosure and their advantages can be better understood with reference to the following drawings and the detailed description that follows. It should be appreciated that like reference numerals are used to identify like elements illustrated in one or more of the figures, where showings therein are for purposes of illustrating examples of the present disclosure and not for purposes of limiting the same. The components in the drawings are not necessarily to scale, emphasis instead being placed upon clearly illustrating the principles of the present disclosure.

DETAILED DESCRIPTION

The present disclosure describes systems and methods that address a need in the art for an improved noise reduction mechanism in multistage amplifiers of modern devices that incorporate internal and external speaker amplifier functionality. The following discussion will be directed to a multistage audio amplifier with a muting mechanism example.

Figure 1:
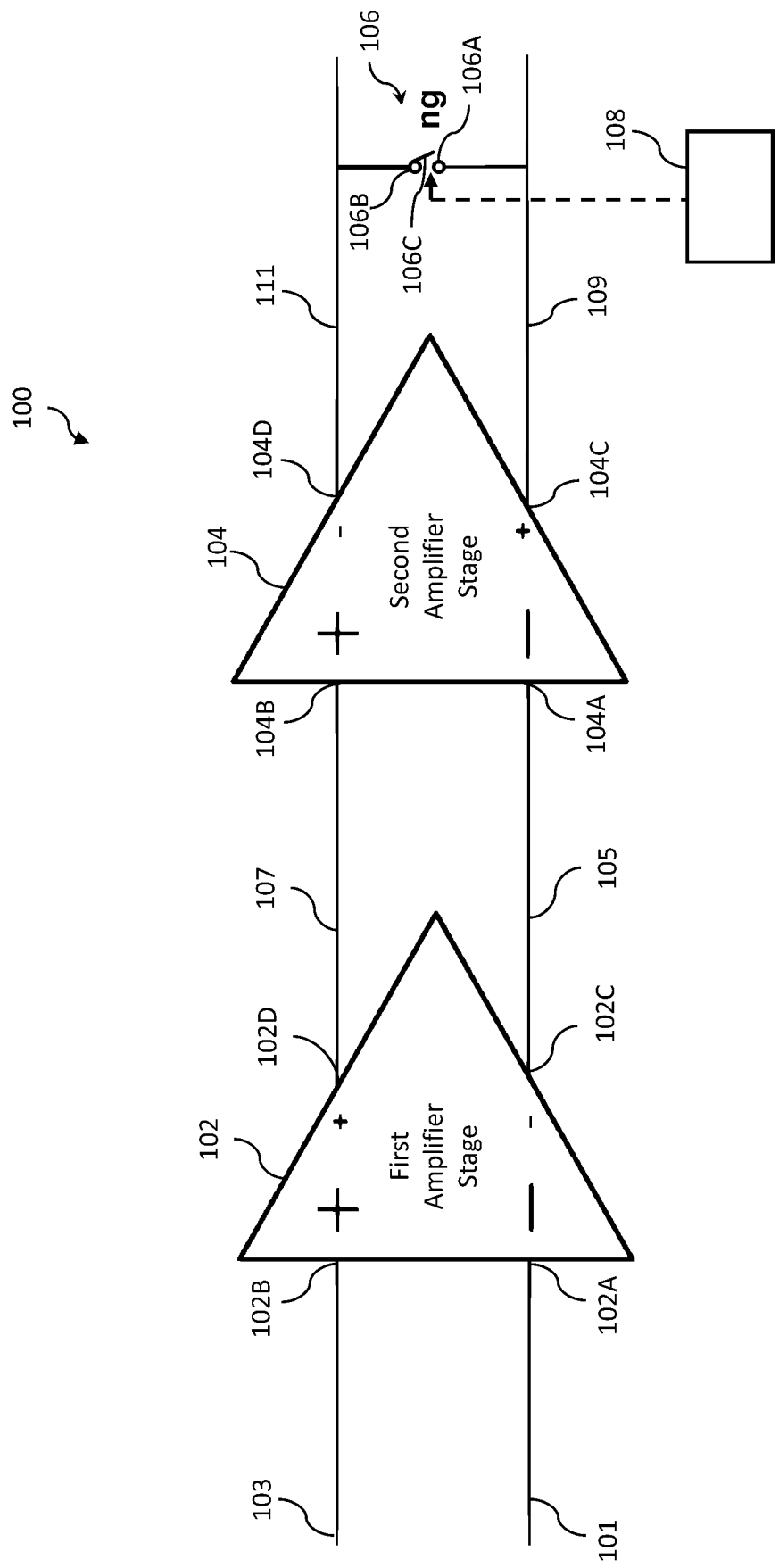
FIG. 1 illustrates a schematic diagram of a multistage amplifier including a conventional noise muting circuit.

FIG. 1 illustrates a schematic diagram of a multistage amplifier 100 including a conventional noise muting circuit. As shown in FIG. 1, the multistage amplifier 100 includes a first stage amplifier 102, a second stage amplifier 104, a noise muting switch 106, and an envelope detection and control circuit 108. In one example, multistage amplifier 100 is implemented as a multistage differential amplifier with first stage amplifier 102 and second stage amplifier 104 implemented as differential amplifiers. In another example, multistage amplifier 100 is implemented as a multistage single ended amplifier with first stage amplifier 102 and second stage amplifier 104 implemented as single ended amplifiers. First stage amplifier 102 receives input signal 101 at inverting input port 102A and input signal 103 at non-inverting input port 102B. First stage amplifier 102 provides amplified output signal 105 at an inverting port 102C and passes amplified output signal 105 to an inverting input port 104A of second stage amplifier 104. First stage amplifier 102 provides amplified output signal 107 at a non-inverting port 102D and passes amplified output signal 107 to a non-inverting input port 104B of second stage amplifier 104. Second stage amplifier 104 provides a multistage amplifier output signal 109 at an output port 104C and a multistage amplifier output signal 111 at an output port 104D.

In one example, noise muting switch 106 includes a switch wiper 106A electrically connected to multistage amplifier output signal 109 and a switch wiper 106B electrically connected to multistage amplifier output signal 111. Envelope detection and control circuit 108 is implemented to control a switch arm 106C of noise muting switch 106 to open and close the noise muting switch 106. In one example, noise muting switch 106 is closed by envelope detection and control circuit 108 to short the multistage amplifier output signal 109 to multistage amplifier output signal 111 during periods when input signals 101 and 103 are of a low level.

In the example shown in FIG. 1, multistage amplifier 100 feedback is broken when noise muting switch 106 is closed. In this regard, even a small input offset at inverting input port 102A and non-inverting input port 102B will result in a large signal at output port 104C and output port 104D. The large signal at output ports of multistage amplifier 100 will induce a contention between closed switch 106 and multistage amplifier 100 resulting in a large current flow through switch 106, and switch 106 would need to be sized accordingly to avoid electrical stress and/or thermal overload. In addition, when multistage amplifier 100 transitions from a noise muting condition to an active condition, all internal nodes of multistage amplifier 100 will take time to settle to their desired value. During that settling time, there may be undesirable pop noise at the multistage amplifier 100 output ports.

Figure 2:
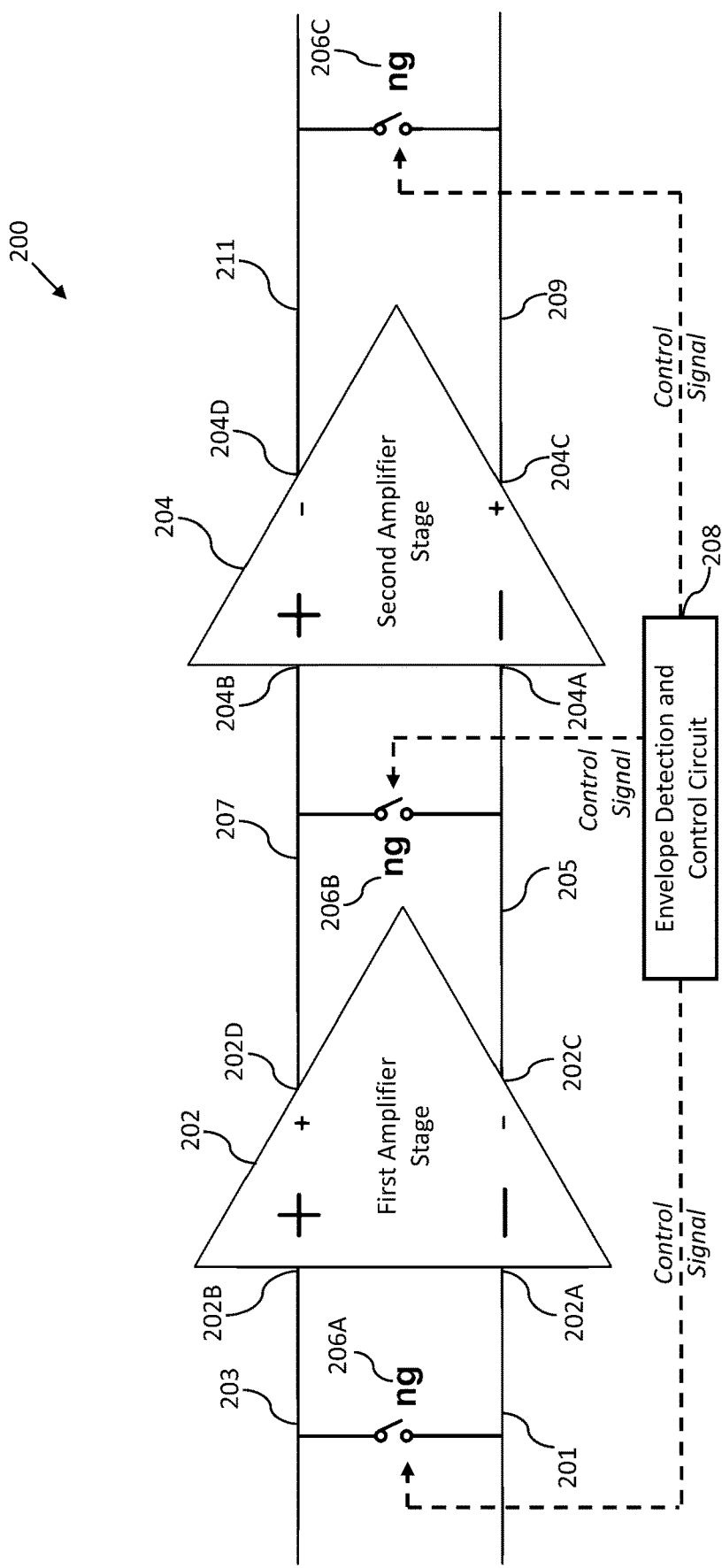
FIG. 2 illustrates an exemplary schematic diagram of a multistage amplifier with improved noise reduction in accordance with an example of the disclosure.

Accordingly, there is a need in the art for improved low signal level noise reduction that provides for improved audio amplifier performance FIG. 2 illustrates an exemplary schematic diagram of a multistage amplifier 200 with improved noise reduction in accordance with an example of the disclosure. As shown in FIG. 2, multistage amplifier 200 includes multiple amplifier stages (e.g., first stage amplifier 202 and second stage amplifier 204), switches 206A-206C, and an envelope detection circuit 208. In one example, multistage amplifier 200 is implemented as a multistage differential amplifier with first stage amplifier 202 and second stage amplifier 204 implemented as differential amplifiers electrically coupled in series. In another example, multistage amplifier 200 is implemented as a multistage single ended amplifier with first stage amplifier 202 and second stage amplifier 204 implemented as single ended amplifiers electrically coupled in series. In some examples, multistage amplifier 200 is implemented with one or more single ended amplifier stages and/or one or more differential amplifier stages. For example, in one non-limiting example, multistage amplifier 200 includes first stage amplifier 202 and second stage amplifier 204 implemented as differential amplifier stages and a third stage amplifier (e.g., not shown) implemented as a single ended amplifier stage.

In various examples, a system includes a multistage amplifier including a mute circuitry that, in operation, reduces noise. The system may include a multistage amplifier 200 including at least a first stage amplifier 202 and a second stage amplifier 204. The system may further include one or more of switch 106 disposed within the multistage amplifier 200 to configure multistage amplifier 200 between a mute state and a normal amplification mode. A control signal (e.g., output from envelope detection circuit 208), controls the switches of the multistage amplifier 200 to switch between the normal amplification mode and the mute state. In the normal amplification mode, the multistage amplifier 200 will amplify the input signal. In the mute state, the amplifier is disabled, and the multistage amplifier is adapted to output a zero signal, which may include entering a quiescent operating state, a DC operating state, or shorting the output ports to effectively mute the amplifier. In some examples, in the mute state, the internal amplification stages (e.g., 202 and 204 of the illustrated example) of multistage amplifier 200, are also disabled and the output ports of internal amplification stages are shorted to each other and/or connected to a replica bias voltage signal.

In some examples, at least one of the stages of the multistage amplifier is configured as a differential amplifier, and outputs (e.g., output stages) of internal amplification stages of the differential amplifier are electrically shorted to each other in the mute state. In some examples, at least one of the stages of the multistage amplifier is configured as a single ended amplifier, and the internal amplification stages of the single ended amplifier are shorted to a fixed bias voltage in the mute state. In various examples, an output of the multistage amplifier 200 is electrically shorted to a ground signal in the mute state (e.g., when at least one of the stages of the multistage amplifier is configured as a single ended amplifier).

In various examples, multistage amplifier 200 is implemented to receive an input signal 201 at an inverting input port 202A and an input signal 203 at a non-inverting input port 202B of first stage amplifier 202. As illustrated in FIG. 2, first stage amplifier 202 provides an amplified output signal 205 at an inverting output port 202C and passes amplified output signal 205 to an inverting input port 204A of second stage amplifier 204. First stage amplifier 202 provides an amplified output signal 207 at a non-inverting output port 202D and passes amplified output signal 207 to a non-inverting input port 204B of second stage amplifier 204. Second stage amplifier 204 provides a multistage amplifier output signal 209 at a non-inverting output port 204C and a multistage amplifier output signal 211 at an inverting output port 204D (e.g., a differential pair of output ports).

In some examples, envelope detection circuit 208 is implemented to sense a voltage at input port of multistage amplifier 200 (e.g., at inverting input port 202A and non-inverting input port 202B) and control the switches 206A-206C responsive to the sensed voltage. In some examples, envelope detection circuit 208 controls the switches 206A-206C in response to the sensed voltage being below an idle noise threshold value of the multistage amplifier 200 (e.g., a multistage amplifier idle noise threshold value). In some examples, an idle noise threshold value is minus 130 dB for low input signal levels. However, other idle noise threshold values are possible for other multistage amplifier implementations, for example, minus 135 dB and/or minus 140 dB.

In some examples, switches 206 are disposed within multistage amplifier 200 and coupled to an output of each of amplifier stages (e.g., first stage amplifier 202 and second stage amplifier 204). Envelope detection circuit 208 controls the switches 206A-206C to electrically connect the differential pair of outputs of each of the amplifier stages (e.g., such as inverting output port 202C and non-inverting output port 202D of first stage amplifier 202, and non-inverting output port 204C and inverting output port 204D of second stage amplifier 204) to a DC voltage signal that is substantially equal to a quiescent operating voltage of each of the amplifier stages in response to the sensed voltage. In various examples, intermediate amplifier stages (e.g., such as first stage amplifier 202) have their outputs disabled prior to connecting the DC voltage signal to the output ports to avoid any electrical stress or voltage contention at the output port. In some examples, at least one switch 206 of the multiple switches is coupled to an input port of multistage amplifier 200 operable to electrically connect the input port to the DC voltage signal.

In one example, switch 206A includes a switch wiper 216A electrically connected to inverting input port 202A and a switch wiper 216B electrically connected to non-inverting input port 202B. Envelope detection circuit 208 is implemented to control a switch arm 216C of switch 206A to open and close the switch 206A. In one example, switch 206A is closed by envelope detection circuit 208 to electrically short the inverting input port 202A to non-inverting input port 202B (e.g., short the differential pair of input ports) during periods when input signals 201 and 203 are below the idle noise threshold level of multistage amplifier 200. In addition, envelope detection circuit 208 is implemented to close the switch 206B and switch 206C when input signal 201 and input signal 203 are below the idle noise threshold level of multistage amplifier 200. In some examples, a control signal (not shown) is provided to first stage amplifier 202 and second stage amplifier 204 to command a muting function of first stage amplifier 202 and second stage amplifier 204 responsive to a detected input signal below the idle noise threshold value.

In one example, each switch 206 is implemented as an n-channel metal-oxide semiconductor field-effect transistor (NMOSFET) switch. In another example, each switch 206 is implemented as a complementary switch including an n-channel metal-oxide semiconductor field-effect transistor switch and p-channel metal-oxide semiconductor field-effect transistor (PMOSFET) switch electrically connected in series.

As shown in FIG. 2, for the multistage differential amplifier implementation, envelope detection circuit 208 controls switch 206B to electrically connect first stage amplifier 202 inverting output port 202C to non-inverting output port 202D. Envelope detection circuit 208 controls the switch 206C to electrically connect second stage amplifier 204 non-inverting output port 204C to inverting output port 204D. In this regard, envelope detection circuit 208 electrically connects each of the plurality of differential amplifiers output ports to each other when the sensed voltage is below an idle noise threshold value of the multistage differential amplifier.

In one example, multistage differential amplifier implementation of FIG. 2 includes a differential amplifier replica bias voltage signal that is substantially equal to a quiescent operating voltage (e.g., the quiescent operating voltage of each of first stage amplifier 202 and second stage amplifier 204). In some examples, differential amplifier replica bias voltage signal substantially equals a common mode voltage of each of first stage amplifier 202 and second stage amplifier 204. In one example, switch 206A is controlled to electrically connect the differential amplifier replica bias voltage signal to each of inverting input port 202A and non-inverting input port 202B (e.g., differential pair of inputs) when the sensed voltage is below the idle noise threshold value of the multistage differential amplifier implementation of FIG. 2.

In another example, switch 206B is controlled to electrically connect the differential amplifier replica bias voltage signal to each of inverting output port 202C and non-inverting output port 202D, and switch 206C is controlled to electrically connect the differential amplifier replica bias voltage signal to each of non-inverting output port 204C and inverting output port 204D when the sensed voltage is below the idle noise threshold value of the multistage differential amplifier implementation of FIG. 2. In yet another example, switch 206A is controlled to electrically short the inverting input port 202A and non-inverting input port 202B (e.g., differential pair of inputs) to each other when the sensed voltage is below the idle noise threshold value.

Figure 3:
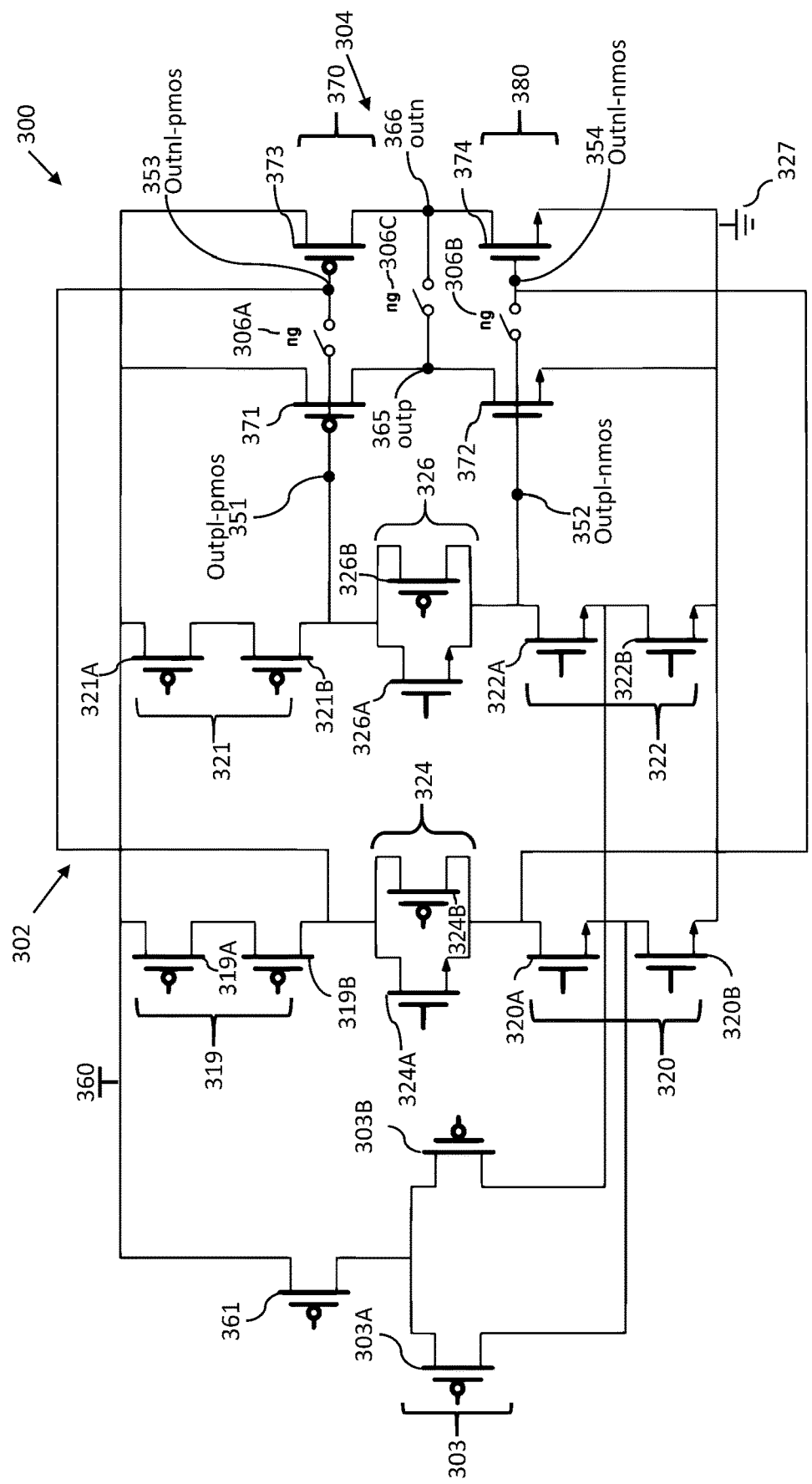
FIG. 3 illustrates an exemplary schematic diagram of a differential multistage amplifier with improved noise reduction in accordance with an example of the disclosure.

FIG. 3 illustrates an exemplary schematic diagram of a differential multistage amplifier 300 with improved noise reduction in accordance with an example of the disclosure. As shown in FIG. 3, differential multistage amplifier 300 is implemented as a two-stage amplifier. In this regard, differential multistage amplifier 300 includes a first stage differential amplifier 302 and a second stage differential amplifier 304 (e.g., second stage differential amplifier 304 illustrated by node 365 (outp) and node 366 (outn)). First stage differential amplifier 302 includes a multistage differential amplifier input port 303 including a first input port PMOSFET transistor 303A and a second input port PMOSFET transistor 303B. First stage differential amplifier 302 also includes a first current source 319 including PMOSFET transistors 319A and 319B, a second current source 320 including NMOSFET transistors 320A and 320B, a third current source 321 including PMOSFET transistors 321A and 321B, and a fourth current source 322 including NMOSFET transistors 322A and 322B. Drain terminals of NMOSFET transistor 320B of second current source 320 and NMOSFET transistor 322B of fourth current source 322 are connected to ground signal 327.

A PMOSFET transistor power switch 361 is electrically connected to voltage source 360 at a source terminal and multistage differential amplifier input port 303 at a drain terminal. In one example, voltage source 360 is a five-volt DC voltage source. In other examples, voltage source 360 is a 10-volt DC voltage source. However, voltage source 360 may be any DC voltage source appropriate to provide voltage to multistage differential amplifier input port 303.

First stage differential amplifier 302 includes a first float battery 324 that includes an NMOSFET transistor 324A connected in parallel to a PMOSFET transistor 324B. First current source 319 and second current source 320 are connected to first float battery 324. First stage differential amplifier 302 also includes a second float battery 326 that includes an NMOSFET transistor 326A connected in parallel to a PMOSFET transistor 326B. Third current source 321 and fourth current source 322 are connected to second float battery 326.

First stage differential amplifier 302 includes a first output stage 370 that includes a PMOSFET transistor 371 and a PMOSFET transistor 373. First stage differential amplifier 302 includes a second output stage 380 that includes an NMOSFET transistor 372 and an NMOSFET transistor 374. First output stage 370 and second output stage 380 are connected to second stage differential amplifier 304 at node 365 and node 366.

In one example, envelope detection circuit 208 (e.g., such as envelope detection circuit 208 of FIG. 2) controls the switch 306A, switch 306B, and switch 306C to close simultaneously. Switch 306A electrically shorts the PMOSFET transistor 371 to PMOSFET transistor 373 at node 351 and node 353, respectively. Switch 306B electrically shorts the NMOSFET transistor 372 to NMOSFET transistor 374 at node 352 and node 354, respectively. Switch 306C electrically shorts the node 365 to node 366 of second stage differential amplifier 304. In this regard, each of first stage differential amplifier 302 first output stage 370 and second output stage 380 transistors are shorted to each other when the sensed voltage is below the idle noise threshold value. In addition, second stage differential amplifier 304 output is shorted at node 365 and node 366 when the sensed voltage is below the idle noise threshold value.

Figure 4:
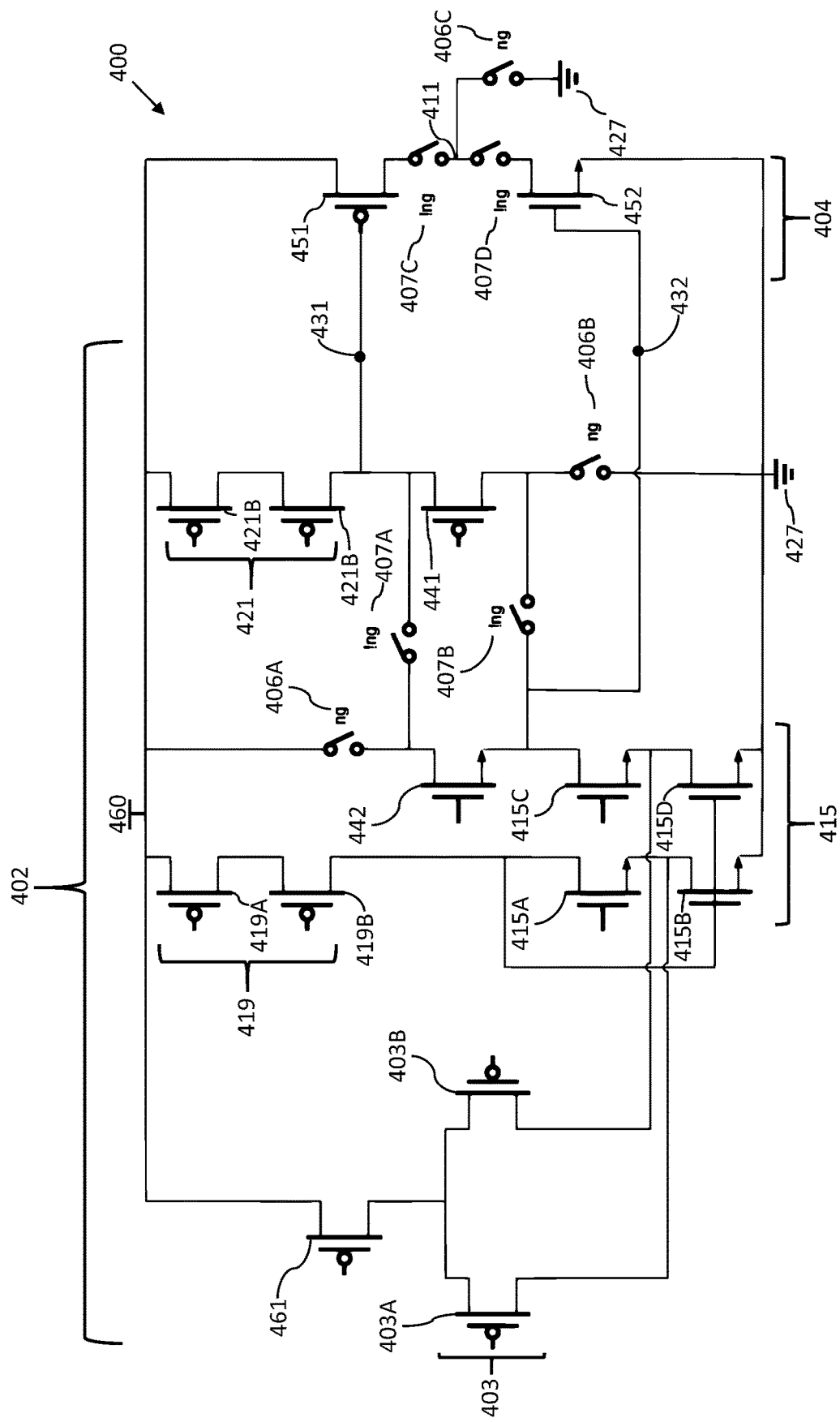
FIG. 4 illustrates an exemplary schematic diagram of a single ended multistage amplifier with improved noise reduction in accordance with the disclosure.

FIG. 4 illustrates an exemplary schematic diagram of a multistage single ended amplifier 400 with improved noise reduction in accordance with the disclosure. For example, as illustrated in FIG. 4, multistage single ended amplifier 400 includes a first stage single ended amplifier 402 and a second stage single ended amplifier 404. First stage single ended amplifier 402 includes a multistage single ended amplifier input port 403 including a first input port PMOSFET transistor 403A and a second input port PMOSFET transistor 403B. First stage single ended amplifier 402 also includes a first current source 419 including PMOSFET transistors 419A and 419B, and a second current source 421 including PMOSFET transistors 421A and 421B. First stage single ended amplifier 402 also includes current mirror circuit 415 including NMOSFET transistors 415A-415D connected to first current source 419. A PMOSFET transistor power switch 461 is electrically connected to voltage source 460 at a source terminal and multistage single ended amplifier input port 403 at a drain terminal. In one example, voltage source 460 is a five-volt DC voltage source. In other examples, voltage source 460 is a 10-volt DC voltage source. However, voltage source 460 may be any DC voltage source appropriate to provide voltage to multistage single ended amplifier input port 403.

As shown in FIG. 4, second stage single ended amplifier 404 includes output PMOSFET transistor 451 and output NMOSFET transistor 452. Output PMOSFET transistor 451 is connected to normal operating switch 407C at a drain terminal and output NMOSFET transistor 452 is connected to normal operating switch 407D at a source terminal. Both normal operating switch 407C and normal operating switch 407D are connected to switch 406C. When closed, switch 406C is connected to ground signal 427 by operation of envelope detection circuit 208. In this regard, envelope detection circuit 208 controls the switch 406C to electrically connect switch 406C to ground signal 427 when the sensed voltage is below a multistage single ended amplifier idle noise threshold value.

In one example, simultaneous with switch 406C connecting to ground signal 427, envelope detection circuit 208 controls the switch 406A and switch 406B. Switch 406A and switch 406B are used to re-configure internal circuit nodes of first stage single ended amplifier 402. For example, switch 406A is closed to connect voltage source 460 to a drain terminal of NMOSFET transistor 442. Switch 406B is closed to connect a drain terminal of PMOSFET transistor 441 to ground signal 427.

In addition, envelope detection circuit 208 controls the normal operating switch 407A, normal operating switch 407B, normal operating switch 407C, and normal operating switch 407D simultaneously with switch 406C closure. Normal operating switch 407C is opened to disconnect a drain terminal of PMOSFET transistor 441 from output port 411 of second stage single ended amplifier 404. Normal operating switch 407D is opened to disconnect a drain terminal of NMOSFET transistor 442 from output port 411 of second stage single ended amplifier 404.

Normal operating switch 407A is opened to disconnect a drain terminal of NMOSFET transistor 442 from a source terminal of PMOSFET transistor 441. Normal operating switch 407B is opened to disconnect a source terminal of NMOSFET transistor 442 from a drain terminal of PMOSFET transistor 441. In this regard, NMOSFET transistor 442 is re-configured to connect to a gate terminal of output NMOSFET transistor 452 of second single ended amplifier 404, and node 432 of first stage single ended amplifier 402 is re-configured to substantially equal a single ended replica bias voltage signal of approximately five tenths of a volt (e.g., such as prior to opening of normal operating switch 407C and normal operating switch 407D). In some examples, single ended amplifier replica bias voltage signal is substantially equal to the quiescent operating voltage of first stage single ended amplifier 402.

PMOSFET transistor 441 is re-configured to connect a source terminal to a gate terminal of output PMOSFET transistor 451 of second stage single ended amplifier 404, and node 431 of first stage single ended amplifier 402 is re-configured to substantially equal a single ended amplifier replica bias voltage signal of approximately seven tenths of a volt (e.g., such as prior to opening of normal operating switch 407C and normal operating switch 407D). In some examples, single ended amplifier replica bias voltage signal is substantially equal to the quiescent operating voltage of first stage single ended amplifier 402.

In this regard, envelope detection circuit 208 controls the normal operating switch 407A, normal operating switch 407B, normal operating switch 407C, and normal operating switch 407D, and switch 406A, switch 406B and switch 406A to electrically connect output ports of first stage single ended amplifier 402 and second stage single ended amplifier 404 to the single ended amplifier replica bias voltage signal when the sensed voltage is below a multistage single ended amplifier idle threshold value. In various examples, envelope detection circuit 208 controls multiple switches to electrically connect multistage single ended amplifier input port 403 to the single ended amplifier replica bias voltage signal when the sensed voltage is below a multistage single ended amplifier idle noise threshold value. In other examples, envelope detection circuit 208 controls multiple switches to electrically connect multistage single ended amplifier input port 403 to ground signal 427 when the sensed voltage is below a multistage single ended amplifier idle noise threshold value.

Figure 5:
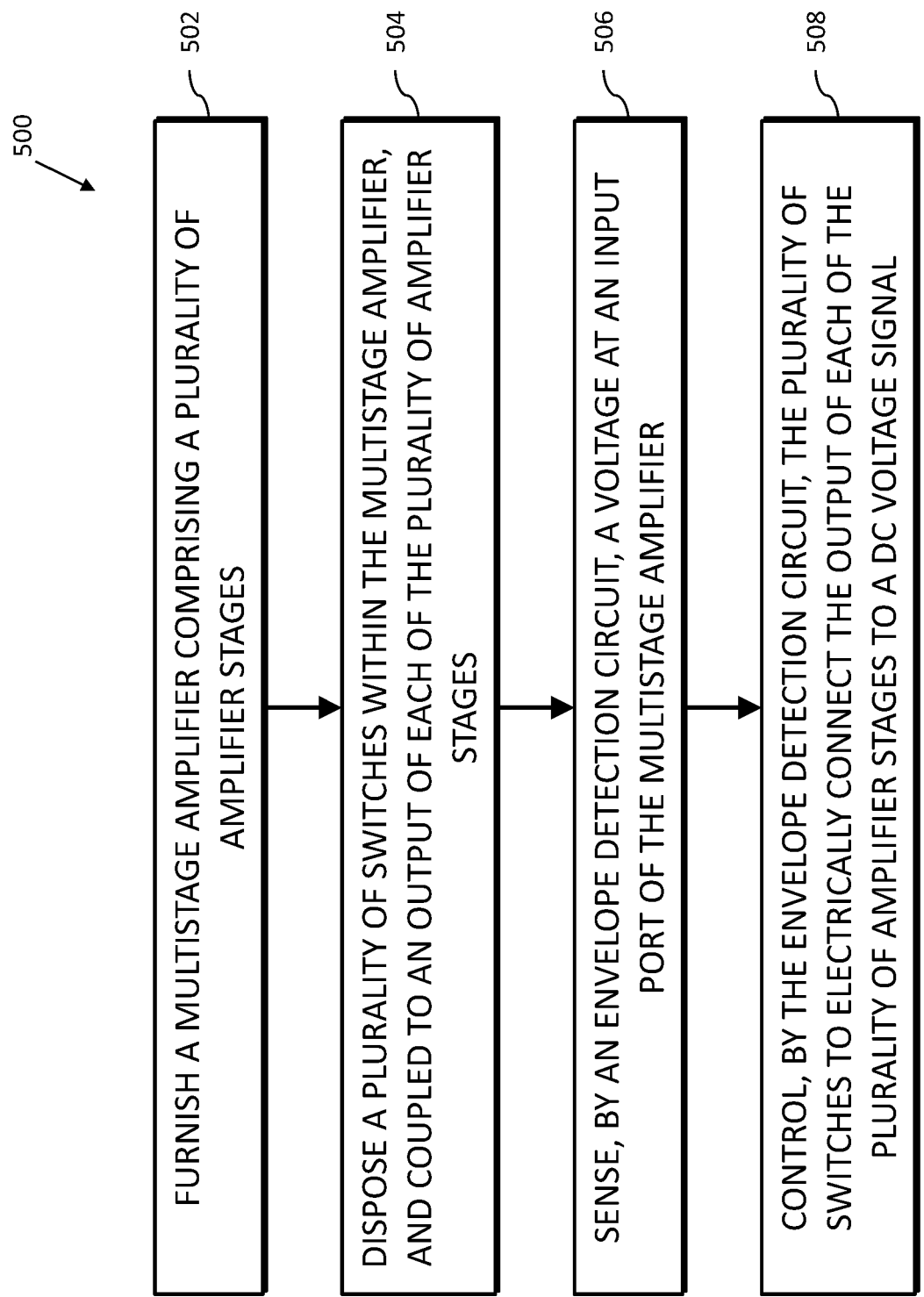
FIG. 5 is a flow chart illustrating a method for operation of a noise reduction circuit in a multistage amplifier in accordance with an example of the disclosure.

FIG. 5 is a flow chart illustrating a method 500 for operation of a noise reduction circuit in accordance with an example of the disclosure. Method 500 begins with operations of step 502, furnishing a multistage amplifier comprising a plurality of amplifier stages. In one example, multistage amplifier may be implemented as a differential multistage amplifier. In another example, multistage amplifier may be implemented as a single ended multistage amplifier. In yet another example, multistage amplifier may be implemented as one or more differential amplifier stages and one or more single ended amplifier stages, all connected in series.

Method 500 may further include operations (step 504) of disposing a plurality of switches within the multistage amplifier. In one example, the plurality of switches may be coupled to an output of each of the plurality of amplifier stages. In another example, the plurality of switches may be coupled to one or more internal nodes and/or components of each of the plurality of amplifier stages.

Method 500 may further include operations (step 506) of sensing a voltage, by an envelope detection circuit, at an output of the multistage amplifier. In some examples, a voltage is sensed at an input of the multistage amplifier. In other examples, a voltage is sensed at an input and/or an output of one more amplifier stages of the multistage amplifier.

Method 500 may further include operations (step 508) of controlling, by the envelope detection circuit, the plurality of switches to electrically connect the output of each of the plurality of amplifier stages to a DC voltage signal that is substantially equal to a quiescent operating voltage of each of the plurality of amplifier stages in response to the sensed voltage.

In view of the present disclosure, it will be appreciated that a multistage amplifier 200 implemented in accordance with various examples set forth herein may provide for noise reduction of a multistage amplifier audio output signal when an amplifier input low level audio signal is detected. The multistage amplifier 200 incorporates a plurality of switches disposed within the multistage amplifier and coupled to an output of each of a plurality of amplifier stages. An envelope detection circuit is configured to sense an input voltage signal and control the plurality of switches to electrically connect the output of each of the plurality of amplifier stages to a DC voltage signal and/or re-configure internal operating voltages within the amplifier stages, all for improved low signal level noise reduction that provides for improved audio amplifier performance.

Where applicable, various examples provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

The foregoing disclosure is not intended to limit the present disclosure to the precise forms or particular fields of use disclosed. As such, it is contemplated that various alternate examples and/or modifications to the present disclosure, whether explicitly described or implied herein, are possible in light of the disclosure. Having thus described examples of the present disclosure, persons of ordinary skill in the art will recognize that changes may be made in form and detail without departing from the scope of the present disclosure. Thus, the present disclosure is limited only by the claims.

What is claimed is:

1. A system comprising:
   a multistage amplifier comprising at least a first stage amplifier and a second stage amplifier;
   a plurality of switches disposed within the multistage amplifier to configure the multistage amplifier;
   an envelope detection circuit configured to generate a control signal to control the multistage amplifier to a normal amplification mode or a mute state;
   wherein the multistage amplifier is adapted to amplify an input signal in the normal amplification mode;
   wherein the multistage amplifier is adapted to output a zero signal in the mute state; and
   wherein internal amplification stages of the multistage amplifier are disabled in the mute state, and output stages of each of the at least first stage amplifier and the second stage amplifier are electrically shorted and/or shorted to a fixed bias voltage in the mute state.

2. The system of claim 1, wherein at least one of the stages of the multistage amplifier is configured as a differential amplifier, and wherein outputs of internal amplification stages of the differential amplifier are electrically shorted to each other in the mute state.

3. The system of claim 1, wherein at least one of the stages of the multistage amplifier is configured as a single ended amplifier, wherein outputs of internal amplification stages of the single ended amplifier are shorted to a fixed bias voltage in the mute state, and wherein an output of the multistage amplifier is electrically shorted to a ground signal in the mute state.

4. A system comprising:
   a multistage amplifier comprising a plurality of amplifier stages;
   a plurality of switches disposed within the multistage amplifier and coupled to an output of each of the plurality of amplifier stages;
   an envelope detection circuit adapted to:
      sense a voltage at an output port of the multistage amplifier; and
      control the plurality of switches to electrically connect the output of each of the plurality of amplifier stages to a DC voltage signal that is substantially equal to a quiescent operating voltage of each of the plurality of amplifier stages in response to the sensed voltage.

5. The system of claim 4, wherein the envelope detection circuit is adapted to control the plurality of switches responsive to the sensed voltage being below an idle noise threshold value of the multistage amplifier, and wherein at least one of the plurality of switches is coupled to an input port of the multistage amplifier operable to electrically connect the input port to the DC voltage signal by the envelope detection circuit.

6. The system of claim 4, wherein the multistage amplifier is a multistage differential amplifier comprising a plurality of differential amplifiers electrically coupled in series, wherein each of the plurality of differential amplifiers comprise a differential pair of output ports comprising an inverting output port and a non-inverting output port, and wherein the envelope detection circuit is adapted to control the plurality of switches to electrically connect the inverting output port to the non-inverting output port of each of the plurality of differential amplifiers when the sensed voltage is below an idle noise threshold value of the multistage differential amplifier.

7. The system of claim 6, further comprising a differential amplifier replica bias voltage signal configured to substantially equal the quiescent operating voltage, wherein the envelope detection circuit is adapted to control the plurality of switches to electrically connect the differential amplifier replica bias voltage signal to each input of a differential pair of inputs of the multistage differential amplifier when the sensed voltage is below an idle noise threshold value of the multistage differential amplifier.

8. The system of claim 7, wherein the envelope detection circuit is adapted to control the plurality of switches to electrically connect the differential amplifier replica bias voltage signal to each output of a differential pair of outputs of the multistage differential amplifier when the sensed voltage is below an idle noise threshold value of the multistage differential amplifier.

9. The system of claim 7, wherein the envelope detection circuit is adapted to control the plurality of switches to electrically short the differential pair of input ports of the multistage differential amplifier to each other when the sensed voltage is below an idle noise threshold value of the multistage differential amplifier.

10. The system of claim 4, wherein the multistage amplifier is a multistage single ended amplifier comprising a plurality of single ended amplifiers electrically coupled in series.

11. The system of claim 10, further comprising a single ended amplifier replica bias voltage signal configured to substantially equal the quiescent operating voltage, wherein the envelope detection circuit is adapted to control the plurality of switches to electrically connect output ports of the single ended amplifiers to the single ended amplifier replica bias voltage signal when the sensed voltage is below a multistage single ended amplifier idle noise threshold value.

12. The system of claim 11, wherein the envelope detection circuit is adapted to control the plurality of switches to electrically connect a multistage single ended amplifier input port to the single ended amplifier replica bias voltage signal when the sensed voltage is below a multistage single ended amplifier idle noise threshold value.

13. The system of claim 12, wherein the envelope detection circuit is adapted to control the plurality of switches to electrically connect a multistage single ended amplifier input port to a ground signal when the sensed voltage is below a multistage single ended amplifier idle noise threshold value.

14. A method comprising:
furnishing a multistage amplifier comprising a plurality of amplifier stages;
disposing a plurality of switches within the multistage amplifier and coupled to an output of each of the plurality of amplifier stages;
sensing a voltage, by an envelope detection circuit, at an output port of the multistage amplifier; and
controlling, by the envelope detection circuit, the plurality of switches to electrically connect the output of each of the plurality of amplifier stages to a DC voltage signal that is substantially equal to a quiescent operating voltage of each of the plurality of amplifier stages in response to the sensed voltage.

15. The method of claim 14, wherein the controlling further comprises controlling the plurality of switches when the sensed voltage is below a multistage amplifier idle noise threshold value.

16. The method of claim 14, wherein the multistage amplifier is a multistage differential amplifier comprising a plurality of differential amplifiers electrically coupled in series, and wherein each of the plurality of differential amplifiers comprise a differential pair of output ports comprising an inverting output port and a non-inverting output port, the method further comprising controlling the plurality of switches to electrically connect the inverting output port to the non-inverting output port of each of the plurality of differential amplifiers when the sensed voltage is below an idle noise threshold value of the multistage differential amplifier.

17. The method of claim 16, further comprising a differential amplifier replica bias voltage signal configured to substantially equal the quiescent operating voltage, the method further comprising:
controlling the plurality of switches to electrically connect the differential amplifier replica bias voltage signal to each input of a differential pair of inputs of the multistage differential amplifier when the sensed voltage is below an idle noise threshold value of the multistage differential amplifier; and
controlling the plurality of switches to electrically connect the differential amplifier replica bias voltage signal to each output of a differential pair of outputs of the multistage differential amplifier when the sensed voltage is below an idle noise threshold value of the multistage differential amplifier.

18. The method of claim 16, further comprising controlling the plurality of switches to electrically short the differential pair of inputs of the multistage differential amplifier to each other when the sensed voltage is below an idle noise threshold value of the multistage differential amplifier.

19. The method of claim 14, wherein the multistage amplifier is a multistage single ended amplifier comprising a plurality of single ended amplifiers electrically coupled in series, and further comprising a single ended amplifier replica bias voltage signal configured to substantially equal the quiescent operating voltage, the method further comprising:
electrically connecting output ports of the plurality of single ended amplifiers to the single ended amplifier replica bias voltage signal when the sensed voltage is below a multistage single ended amplifier idle noise threshold value; and
electrically connecting a multistage single ended amplifier input port to the single ended amplifier replica bias voltage signal when the sensed voltage is below a multistage single ended amplifier idle noise threshold value.

20. The method of claim 19, the method further comprising electrically connecting the multistage single ended amplifier input port to a ground signal when the sensed voltage is below a multistage single ended amplifier idle noise threshold value.

* * * * *